US009130126B2

(12) United States Patent  (10) Patent No.: US 9,130,126 B2
Ikeda et al.  (45) Date of Patent: Sep. 8, 2015

(54) SEMICONDUCTOR LIGHT EMITTING DEVICE

(71) Applicant: ROHM CO., LTD., Kyoto (JP)

(72) Inventors: Shigefumi Ikeda, Kyoto (JP); Yasutomo Ochiai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/260,847

(22) Filed: Apr. 24, 2014

(65) Prior Publication Data

US 2014/0319456 A1  Oct. 30, 2014

(30) Foreign Application Priority Data

Apr. 30, 2013  (JP) .................................. 2013-095117

(51) Int. Cl.
H01L 29/88 (2006.01)
H01L 33/38 (2010.01)
H01L 31/00 (2006.01)
H01L 33/40 (2010.01)
H01L 33/20 (2010.01)
H01L 33/42 (2010.01)

(52) U.S. Cl.
CPC ................ H01L 33/38 (2013.01); H01L 31/00 (2013.01); H01L 33/20 (2013.01); H01L 33/405 (2013.01); H01L 33/42 (2013.01)

(58) Field of Classification Search
CPC . H01L 21/38; H01L 21/02348; H01L 21/048; H01L 21/0455; H01L 21/40; H01L 25/167; H01L 27/0814; H01L 27/14625; H01L 29/086; H01L 29/6603; H01L 51/0579; H01L 51/102; H01L 51/5265

USPC ............ 257/655, 607, 290, 200, 201, 40, 79, 257/104, 116, 213, 219, 257, 264, 431, 461, 257/611, 759, 744, 636, E21.006, E21.053, 257/E21.126, E21.127, E21.142, E21.152, 257/E21.267, E21.32, E21.322, E21.352, 257/E21.499
See application file for complete search history.

(56) References Cited

U.S. PATENT DOCUMENTS

| 6,172,382 | B1 * | 1/2001 | Nagahama et al. ............. | 257/94 |
| 6,727,518 | B2 * | 4/2004 | Uemura et al. ................. | 257/79 |
| 7,042,012 | B2 * | 5/2006 | Senda et al. .................... | 257/79 |
| 7,154,125 | B2 * | 12/2006 | Koide et al. .................... | 257/95 |
| 7,244,957 | B2 * | 7/2007 | Nakajo et al. .................. | 257/13 |
| 7,358,539 | B2 * | 4/2008 | Venugopalan et al. ......... | 257/98 |
| 7,759,690 | B2 * | 7/2010 | Miki et al. ...................... | 257/97 |

FOREIGN PATENT DOCUMENTS

JP  2001-044501 A  2/2001

* cited by examiner

*Primary Examiner* — David Nhu
(74) *Attorney, Agent, or Firm* — Rabin & Berdo, P.C.

(57) ABSTRACT

The semiconductor light emitting device includes: a substrate; a first cladding layer disposed on the substrate; an emitting layer disposed on the first cladding layer; a second cladding layer disposed on the emitting layer; a contact layer disposed at a predetermined region on the second cladding layer; an optically transmissive electrode layer disposed on the contact layer; a surface electrode layer disposed on the optically transmissive electrode layer; and an aperture formed by opening a region corresponding to the predetermined region of the surface electrode layer. There is provided a semiconductor light emitting device of which the light extracting efficiency can be improved to achieve high luminance.

22 Claims, 12 Drawing Sheets

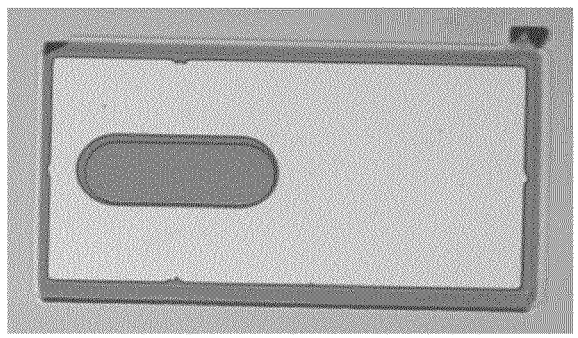
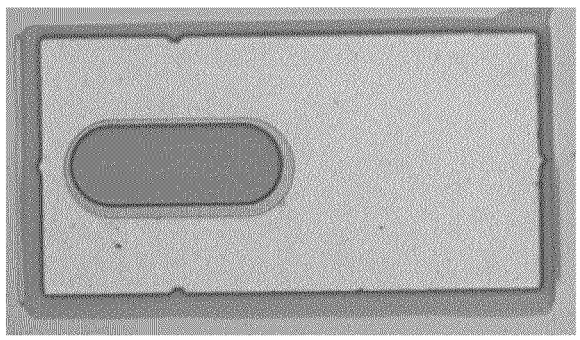
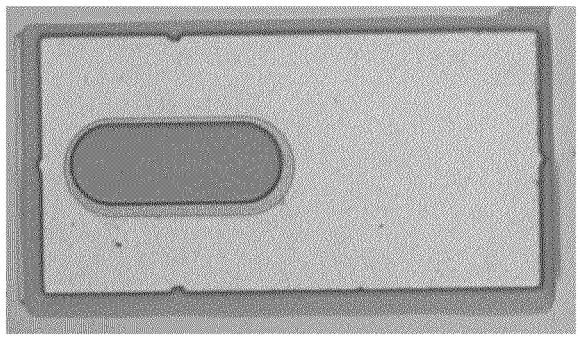
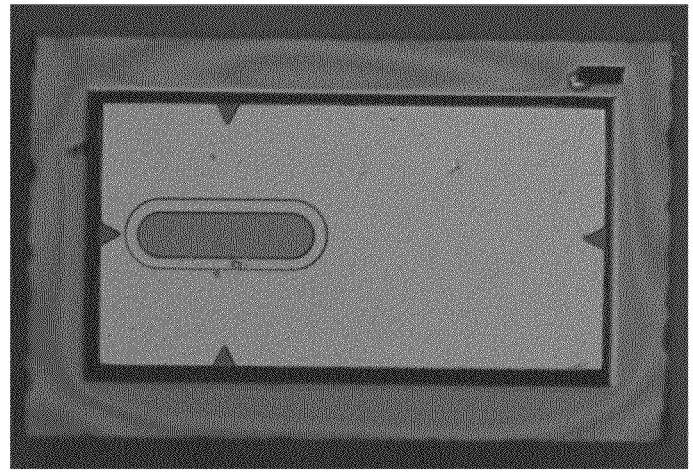

SEMICONDUCTOR LIGHT EMITTING DEVICE

CROSS REFERENCE TO RELATED APPLICATIONS

This application is based upon and claims the benefit of priority from prior Japanese Patent Application No. P2013-95117 filed on Apr. 30, 2013, the entire contents of which are incorporated herein by reference.

TECHNICAL FIELD

The present invention relates to a semiconductor light emitting device, e.g. a light emitting diode, and in particular relates to a current constricted type semiconductor light emitting device applicable to light sources for optical sensors.

BACKGROUND ART

Conventionally, there are known current constricted type semiconductor light emitting devices applicable to light sources for optical sensors.

In such a current constricted type semiconductor light emitting device, an electrode is disposed all over the top surface of a semiconductor layer, and an aperture is formed in the electrode. A point light source is configured to extract the light from the aperture. Since light generated at regions other than the aperture is shielded by the electrode, the light cannot be extracted therefrom and therefore is wasted. For this reason, in order to improve light extracting efficiency, an electric current is constricted so that the electric current may flow only in the region corresponding to a position of the aperture.

In such a current constricted type semiconductor light emitting device, the electric current is constricted, for example by doping impurities in the semiconductor layer (e.g., Refer to Patent Literature 1.).

CITATION LIST

Patent Literature 1: Japanese Patent Application Laying-Open Publication No. 2001-44501

SUMMARY OF THE INVENTION

Technical Problem

However, it is difficult to precisely control a diffusion region doped with the impurities, and therefore it is difficult to flow the electric current through a desired path. Accordingly, there was a problem that it is difficult to miniaturize the element since there was a need to increase a margin for absorbing the error.

The object of the present invention is to provide a current constricted type semiconductor light emitting device of which light extracting efficiency can be improved to achieve high luminance.

Solution to Problem

According to one aspect of the present invention, there is provided a semiconductor light emitting device comprising: a substrate; a first cladding layer disposed on the substrate; an emitting layer disposed on the first cladding layer; a second cladding layer disposed on the emitting layer; a contact layer disposed at a predetermined region on the second cladding layer; an optically transmissive electrode layer disposed on the contact layer; a surface electrode layer disposed on the optically transmissive electrode layer; and an aperture formed by opening a region corresponding to the predetermined region of the surface electrode layer.

Advantageous Effects of Invention

According to the present invention, there can be provided the current constricted type semiconductor light emitting device of which the light extracting efficiency can be improved to achieve high luminance.

BRIEF DESCRIPTION OF DRAWINGS

FIG. 4A shows a surface optical micrograph example of a semiconductor light emitting device according to a comparative example (Sample 1).

FIG. 4B shows a surface optical micrograph example of the semiconductor light emitting device according to the embodiment (Sample 2).

FIG. 4C shows a surface optical micrograph example of the semiconductor light emitting device according to the embodiment (Sample 3).

FIG. 4D shows a surface optical micrograph example of the semiconductor light emitting device according to the embodiment (Sample 4).

FIG. 16A shows an example of an oval-shaped aperture.

FIG. 16B shows an example of a circle-shaped aperture.

FIG. 16C shows an example of a hexagon-shaped aperture.

FIG. 16D shows an example of a triangular-shaped aperture.

FIG. 16E shows an example of a rectangular-shaped aperture.

FIG. 16F shows an example of a square-shaped aperture.

FIG. 16G shows an example of an octagonal-shaped aperture.

FIG. 16H shows an example of a rhombic-shaped aperture.

FIG. 16I shows an example of a pentagon-shaped aperture.

DESCRIPTION OF EMBODIMENTS

Figure 1A:
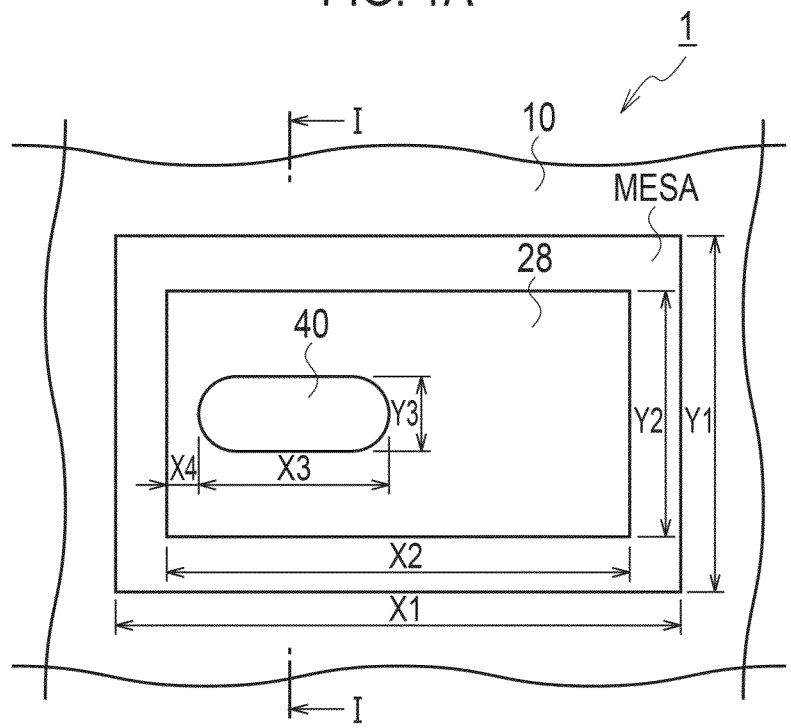
FIG. 1A shows a schematic planar pattern configuration diagram of a semiconductor light emitting device according to an embodiment.

Next, the embodiment of the present invention will now be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiment shown hereinafter exemplifies the apparatus and method for materializing the technical idea of the present invention; and the embodiment of the present invention does not specify the material, shape, structure, placement, etc. of component parts as the following. The embodiment may be changed without departing from the spirit or scope of claims.

In the following explanation, the "GaAs based semiconductor" denotes a semiconductor composed of $Al_xGa_{1-x}As$ (0<=x<=1). Accordingly, each of GaAs, AlGaAs, and AlAs is also included in the "GaAs based semiconductor."

EMBODIMENT

Figure 1B:
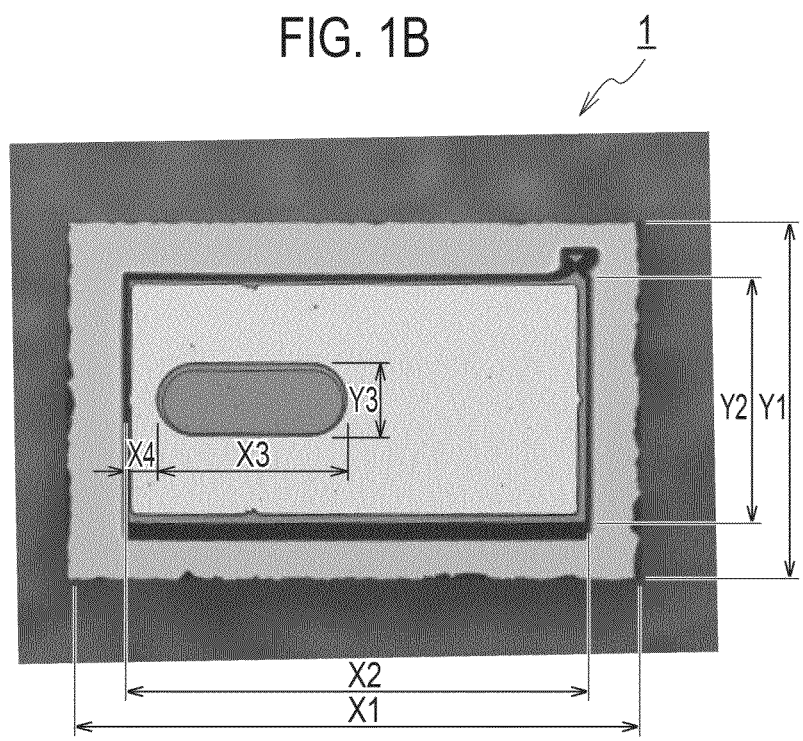
FIG. 1B shows a surface optical micrograph example of the semiconductor light emitting device according to the embodiment made as a prototype.

FIG. 1A shows a schematic planar pattern configuration of a semiconductor light emitting device 1 according to the embodiment, and FIG. 1B shows a surface optical micrograph of a prototype example thereof.

Figure 2:
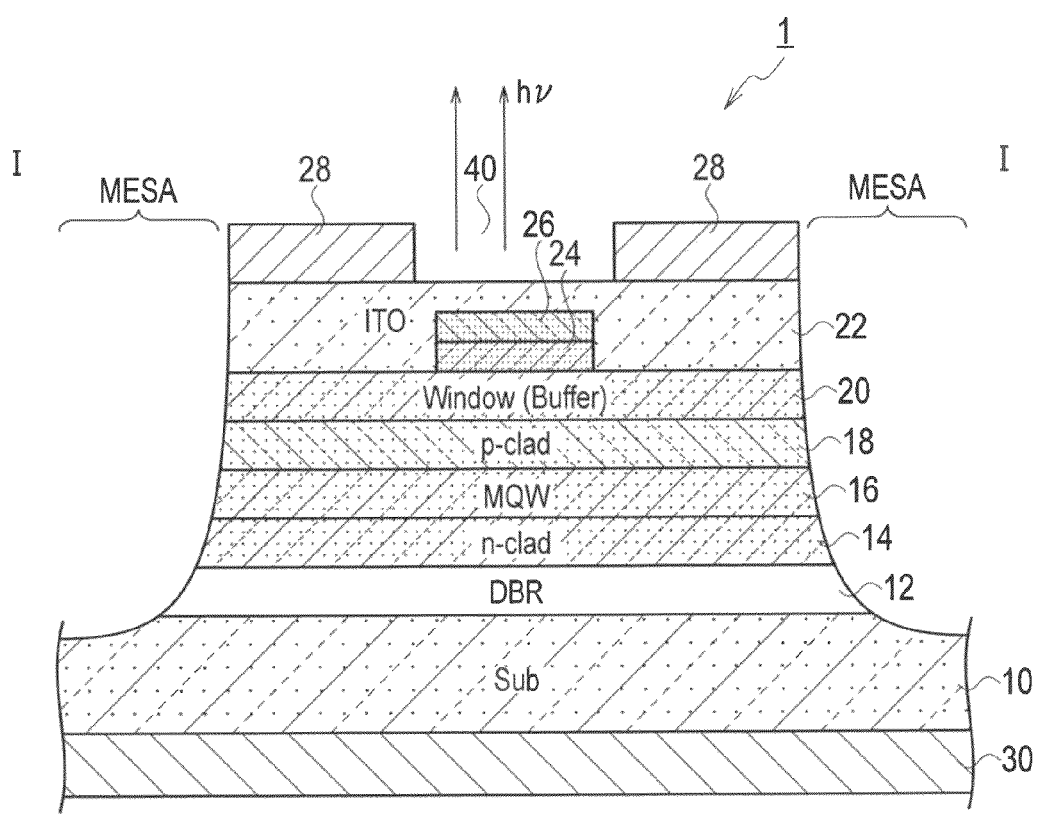
FIG. 2 shows a schematic cross-sectional structure diagram taken in the line I-I of FIG. 1A.

Moreover, FIG. 2 shows a schematic cross-sectional structure taken in the line I-I of FIG. 1A.

As shown in FIGS. 1-2, the semiconductor light emitting device 1 according to the embodiment includes: a substrate 10; a first cladding layer 14 disposed on the substrate 10; an emitting layer 16 disposed on the first cladding layer 14; a second cladding layer 18 disposed on the emitting layer 16; contact layers 24, 26 disposed at a predetermined region on the second cladding layer 18; an optically transmissive electrode layer 22 disposed on the contact layers 24, 26; a surface electrode layer 28 disposed on the optically transmissive electrode layer 22; and an aperture 40 formed by opening the region corresponding to a predetermined region of the surface electrode layer 28. In the embodiment, the emitting layer 16 may include a Multi-Quantum Well (MQW) layer. Alternatively, the emitting layer 16 may includes a single quantum well layer.

An optically transmissive electrode layer 22 has a conductivity type opposite to that of the contact layers 24, 26 and that of the second cladding layer 18. For example, the conductivity type of the optically transmissive electrode layer 22 may be an n type, and the conductivity type of each of the contact layers 24, 26 and the second cladding layer 18 may be a p type.

Moreover, the optically transmissive electrode layer 22 is formed so as to be directly contacted with: the contact layers 24, 26; and a layer formed at a side opposite to the optically transmissive electrode layer 22 with respect to the contact layers 24, 26, and contacted with the contact layer 24 (the window layer 20 or the second cladding layer 18). More specifically, if there is no window layer 20, of the optically transmissive electrode layer 22 is directly contacted with the second cladding layer 18.

Moreover, the impurity density of a portion of the contact layer 26 in contact with the optically transmissive electrode layer 22 is preferable equal to or greater than $1.5 \times 10^{19}$ cm$^{-3}$.

Moreover, the contact layers 24, 26 may include: a first contact layer 26 in contact with the optically transmissive electrode layer 22; and a second contact layer 24 having impurity density lower than that of the first contact layer 26, and is formed in a side opposite to the optically transmissive electrode layer 22 with respect to the first contact layer 26. In the embodiment, the first contact layer 26 may have impurity density equal to or greater than $1.5 \times 10^{19}$ cm$^{-3}$.

Moreover, the thickness of the first contact layer 26 may be formed thinner than the thickness of the second contact layer 24.

Moreover, in the semiconductor light emitting device 1 according to the embodiment, the contact layers 24, 26 may have composition which is not lattice-matched with the substrate 10. The contact layers 24, 26 may further include a window layer 20 formed on the second cladding layer 18 and may be formed on the second cladding layer 18 via the window layer 20.

In the embodiment, the thickness of the window layer 20 may be formed thinner than the thickness of the second cladding layer 18.

More specifically, as shown in FIGS. 1-2, the semiconductor light emitting device 1 according to the embodiment includes: a substrate 10; a first cladding layer 14 disposed on the substrate 10; an emitting layer 16 disposed on the first cladding layer 14; a second cladding layer 18 disposed on the emitting layer 16; a window layer 20 disposed on the second cladding layer 18; a second contact layer 24 disposed on the window layer 20; a first contact layer 26 disposed on the second contact layer 24: an optically transmissive electrode layer 22 disposed on the first contact layer 26; a surface electrode layer 28 disposed on the optically transmissive electrode layer 22; and an aperture 40 opened on surface electrode layer 28. In the embodiment, the aperture 40 is formed on the first contact layer 26. In the embodiment, the emitting layer 16 may include an MQW layer. Alternatively, the emitting layer 16 may includes a single quantum well layer.

Furthermore, a back surface electrode layer 30 is disposed on a back surface side of the substrate 10 opposite to the surface electrode layer 28 on the substrate 10.

As shown in FIGS. 1-2, a mesa etching region MESA is formed at an edge face between the surface electrode layer 28 and the back surface electrode layer 30 of the semiconductor light emitting device 1 according to the embodiment, and a value of a breakdown voltage is ensured between the anode and the cathode.

As shown in FIGS. 1A and 1B, the outer dimensions X1, Y1 of the mesa etching region MESA are approximately X1=582 μm and Y1=366 μm, for example, the outer dimensions X2, Y2 of the surface electrode layer 28 on the MESA trapezoid portion are approximately X2=440 μm and Y1=235 μm, for example, the outer dimensions X3, Y3 of the oval-shaped aperture 40 are approximately X3=191 μm and Y3=72 μm, for example, and the shortest size X4 between the edge part of the aperture 40 and the MESA is approximately 23 μm, for example.

The substrate 10 is formed of GaAs, each of the first cladding layer 14 and the second cladding layer 18 is formed of an AlGaAs layer, and the MQW layer 16 is formed of a pair of GaAs/AlGaAs.

Moreover, the window layer 20 is formed of an AlGaAs layer, and each of the second contact layer 24 and the first contact layer 26 is formed of a GaP layer.

In the embodiment, the impurity density of the first contact layer 26 is formed relatively higher than the impurity density of the second contact layer 24.

The impurity doped in the first contact layer 26 is carbon (C), for example, and the impurity doped in the second contact layer 24 is zinc (Zn) or magnesium (Mg), for example. The impurity doped in the second contact layer 24 may be carbon (C). Each part will now be further explained in detailed.

The substrate 10 is composed of a GaAs single crystal substrate (e.g., 170 μm in thickness). Each layer forming the semiconductor laminated structure is subjected to epitaxial growth on the substrate 10.

The first cladding layer 14 is formed of an n-type $Al_{0.6}Ga_{0.4}As$ layer doped with silicon (Si), for example. The thickness of the first cladding layer 14 is within a range from approximately 0.8 μm to approximately 1.2 μm, for example.

The MQW layer 16 is formed of a pair of a GaAs/$Al_{0.3}Ga_{0.7}As$ composed of an $Al_{0.3}Ga_{0.7}As$ layer as a barrier layer and a GaAs layer a well layer, for example. The number of the pairs is 100, for example. The whole thickness of the MQW layer 16 is within a range from approximately 1.3 μm to approximately 1.6 μm, for example.

The second cladding layer 18 is formed of a p-type $Al_{0.6}Ga_{0.4}As$ layer doped with zinc (Zn), for example. The thickness of the second cladding layer 18 is within a range from approximately 0.8 μm to approximately 1.2 μm, for example.

The window layer 20 is formed of a p-type $Al_{0.3}Ga_{0.7}As$ layer doped with zinc (Zn), for example. The thickness of the window layer 20 is within a range from approximately 0.1 μm to approximately 1.0 μm, for example. The thickness of the window layer 20 is formed thinner than that of the second cladding layer 18. Moreover, the Ga composition ratio of the window layer 20 is larger than that of the second cladding layer 18. Thereby, the crystal quality of crystal growth for the second contact layer 24 composed of GaP (which is not lattice-matched with the GaAs substrate) can be made higher.

The second contact layer 24 is formed of a p-type GaP layer doped with zinc (Zn), for example. The thickness of the second contact layer 24 is within a range from approximately 0.4 μm to approximately 0.8 μm, for example. The Zn concentration in the second contact layer 24 is equal to or greater than approximately $2.0 \times 10^{18}$ cm$^{-3}$, but not more than approximately $6.0 \times 10^{18}$ cm$^{-3}$, for example.

The first contact layer 26 is formed of a p-type GaP layer doped with carbon (C), for example. The thickness of the first contact layer 26 is within a range from approximately 0.3 μm to approximately 0.8 μm, for example.

The carbon density in the first contact layer 26 is equal to or greater than approximately $1.5 \times 10^{19}$ cm$^{-3}$, for example. The carbon density in the first contact layer 26 may be equal to or greater than approximately $1.5 \times 10^{19}$ cm$^{-3}$ but not more than approximately $5.0 \times 10^{19}$ cm$^{-3}$.

Note that, in the C doping in the GaP layer, a carbon tetrabromide ($CBr_4$) can be used for doping raw materials, for example.

Moreover, the area ratio $S_C/S_O$ of area $S_C$ of the first contact layer 26 with respect to area $S_O$ of the aperture 40 is preferable smaller than 1, in the semiconductor light emitting device 1 according to the embodiment. Since light is shielded if the contact layers 26, 24 overlap with the surface electrode 28, the contact layers 26, 24 are formed so as to be fitted inside the aperture 40. This is because the relative light output power $P_O$ from the aperture 40 can be maximized.

Moreover, the optically transmissive electrode layers 22 may be Transparent Conducting Oxide (TCO), e.g. Indium Tin Oxide (ITO), $In_2O_3$, $SnO_2$, ZnO, and InZO. The film thickness of the optically transmissive electrode layer 22 is 300 nm, for example. The vacuum deposition method is preferable to form the optically transmissive electrode layer 22. This is because the sputtering technique may give damage to the window layer 20 and the contact layer (26, 24).

Moreover, a Distributed Bragg Reflector (DBR) layer may be formed between the substrate 10 and the first cladding layer 14. In the embodiment, the DBR layer may be formed of 10 pairs of GaAs/$Al_{0.8}Ga_{0.2}As$, for example.

In the semiconductor light emitting device 1 according to the embodiment, ITO having satisfactory contact performance with the first contact layer 26 is used, for example, as the optically transmissive electrode layer 22, in order to reduce the electric current conducted between the anode electrode (surface electrode layer 28) and the cathode electrode (back surface electrode layer 30).

The ITO becomes relatively easy to electrically contact to the highly-doped GaP layer doped with C compared with the relatively lowly-doped GaP layer doped with Zn. The electric current is diffused, when flowing into an active layer (MQW), but it can control a diffusion of the electric current by forming the thickness of the window layer 20 relatively thinner.

The light extracting efficiency can be improved by reducing the electric current since the light is relatively strongly emitted at directly under the contact part (second contact layer 24).

Moreover, the ITO is an n-type semiconductor, and therefore the contact resistance of the ITO with the highly impurity-doped GaP layer (first contact layer 26) is relatively lower than that of the lowly impurity-doped GaP layer (second contact layer 24). Moreover, the contact resistance between the ITO and the first contact layer 26 also lower than the contact resistance between the ITO and the window layer 20. Accordingly, the electric current conducting between the anode electrode (surface electrode layer 28) and the cathode electrode (back surface electrode layer 30) can be conducted with the interface between the ITO(22) and the first contact layer 26 relatively more than the lower part of the surface electrode layer 28 in planar view. As a result, more light can be efficiently extracted through the aperture 40.

The second contact layer 24 is a layer for improving the crystallinity of the first contact layer 26. More specifically, although crystal defects occur and thereby the crystallinity worsens as the formed layer of the GaP layer (first contact layer 26) doped with C becomes thicker, the crystallinity of the GaP layer (first contact layer 26) doped with C can be made satisfactory by forming the first contact layer 26 via the second contact layer 24 on the window layer 20, as shown in FIG. 2.

Two layers of the contact layer of which the carrier density is varied in this way are required for the semiconductor light emitting device 1 according to the embodiment. However, since the crystallinity may be made higher as the carrier density of the interface with the ITO is made higher, a configuration in which the carbon density is made higher gradually from the interface with the window layer to the ITO side may be used, for example.

In the semiconductor light emitting device 1 according to the embodiment, since the lattice constant of the second cladding layer (p cladding layer) 18 is different from the lattice constant of the relatively lowly-doped GaP layer (second contact layer) 24 doped with Zn, the $Al_{0.3}Ga_{0.7}As$ layer is inserted as a buffer layer (window layer 20) between the second cladding layer (p cladding layer) 18 and the relatively lowly-doped GaP layers (second contact layer) 24 doped with Zn. This is because the crystallinity of the second contact layer 24 is improved by inserting the window layer 20 between the second cladding layer 18 and the second contact layer 24. Moreover, the crystallinity of the first contact layer 26 is also improved by disposing the second contact layer 24.

In the semiconductor light emitting device 1 according to the embodiment, it is preferred that the carbon density in the first contact layer 26 is equal to or greater than $1.5 \times 10^{19}$ cm$^{-3}$. This is because resistance of the first contact layer 26 becomes larger, if the carbon density is less than $1.5 \times 10^{19}$ cm$^{-3}$, and therefore contact resistance between the optically transmissive electrode layer 22 and the p-type window layer 20 cannot sufficiently reduced.

Specifically, in the semiconductor light emitting device 1 according to the embodiment, it is preferred that the carbon density in the first contact layer 26 is equal to or greater than $1.5 \times 10^{19}$ cm$^{-3}$ but not more than $5.0 \times 10^{19}$ cm$^{-3}$. This is because the GaP crystal in the first contact layer 26 may be deteriorated if the carbon density is more than $5.0 \times 10^{19}$ cm$^{-3}$.

(Electrode Layer Structure)

Figure 3A:
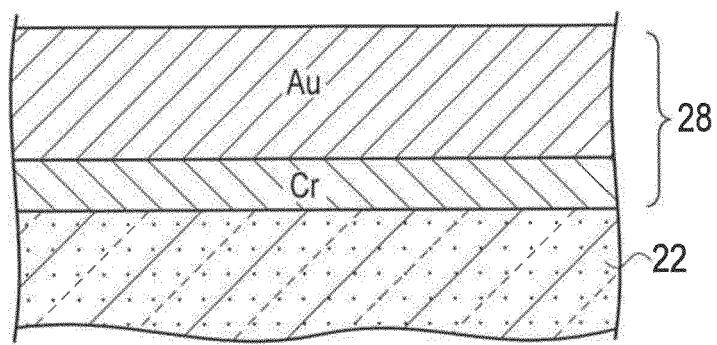
FIG. 3A shows a schematic cross-sectional structure diagram of an electrode portion on the front surface side of the semiconductor light emitting device according to the embodiment.
Figure 3B:
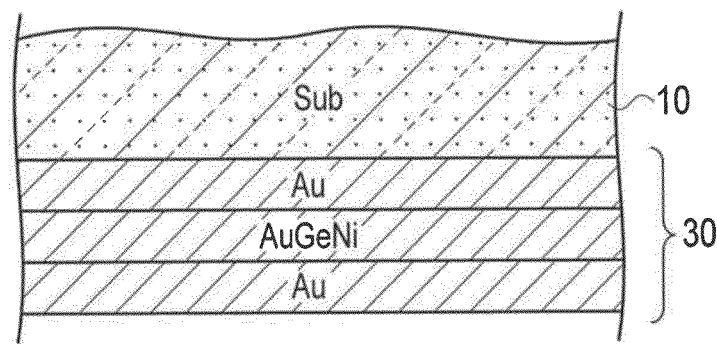
FIG. 3B shows a schematic cross-sectional structure diagram of an electrode portion on the back surface side of the semiconductor light emitting device according to the embodiment.

FIG. 3A shows a schematic cross-sectional structure of the surface electrode layer 28 portion at the front surface side of the semiconductor light emitting device 1 according to the embodiment, and FIG. 3B shows a schematic cross-sectional structure of the back surface electrode layer 30 portion. The surface electrode layer 28 of the semiconductor light emitting device 1 according to the embodiment includes: a Cr layer disposed on the optically transmissive electrode layer 22, and a first Au layer disposed on the Cr layer, as shown in FIG. 3A. In the embodiment, the thickness of the Cr layer is within a range from approximately 0.03 µm to approximately 0.05 µm, for example, and the thickness of the first Au layer is within a range from approximately 2.0 µm to approximately 3.0 µm, for example.

As shown in FIG. 3B, the back surface electrode layer 30 of the embodiment includes: a second Au layer disposed on the substrate 30; an AuGeNi layer disposed on the second Au layer; and a third Au layer disposed on the AuGeNi layer. In the embodiment, the thickness of the second Au layer is within a range from approximately 0.03 µm to approximately 0.08 µm, for example, the thickness of AuGeNi layer is within a range from approximately 0.15 µm to approximately 0.17 µm, for example, and the thickness of the third Au layer is within a range from approximately 0.15 µm to approximately 0.17 µm, for example.

(Surface Optical Micrograph Example)

FIG. 4A shows a surface optical micrograph example of the semiconductor light emitting device according to the comparative example (Sample 1), and FIGS. 4B-4D respectively show surface optical micrograph examples of the semiconductor light emitting devices according to the embodiment (Samples 2-4).

Figure 5:
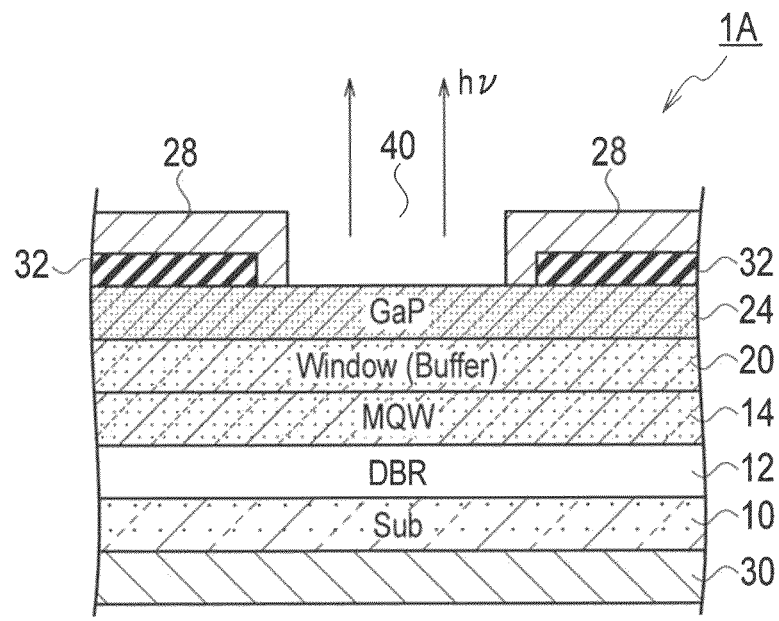
FIG. 5 shows a schematic cross-sectional structure diagram of the semiconductor light emitting device according to the comparative example (Sample 1).
Figure 6:
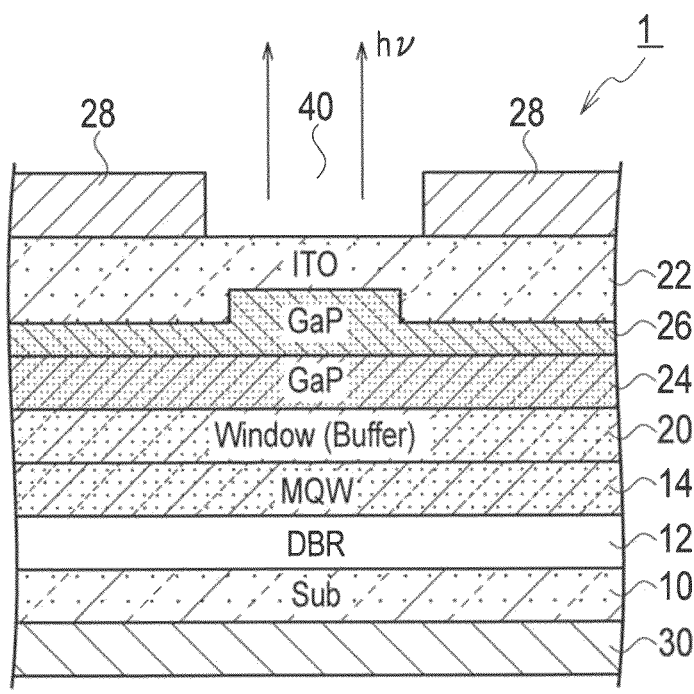
FIG. 6 shows a schematic cross-sectional structure diagram of the semiconductor light emitting device according to the embodiment (Sample 2).
Figure 7:
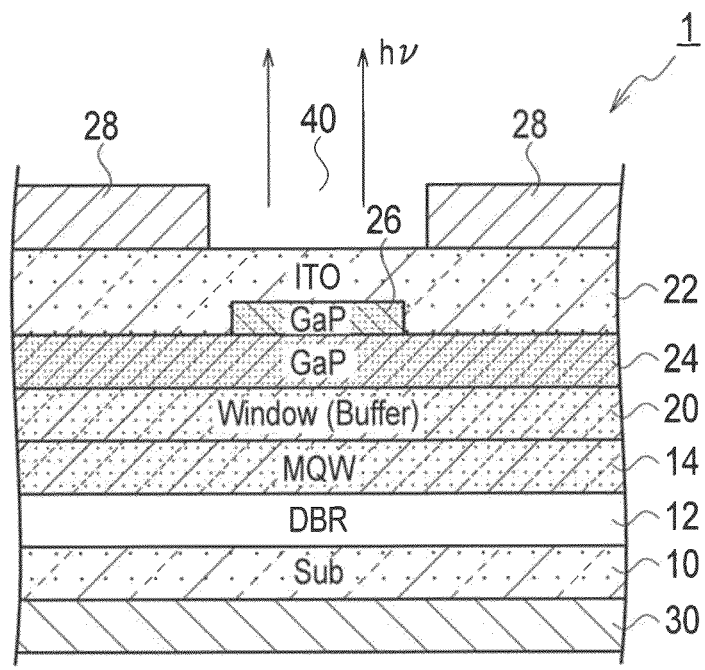
FIG. 7 shows a schematic cross-sectional structure diagram of the semiconductor light emitting device according to the embodiment (Sample 3).
Figure 8:
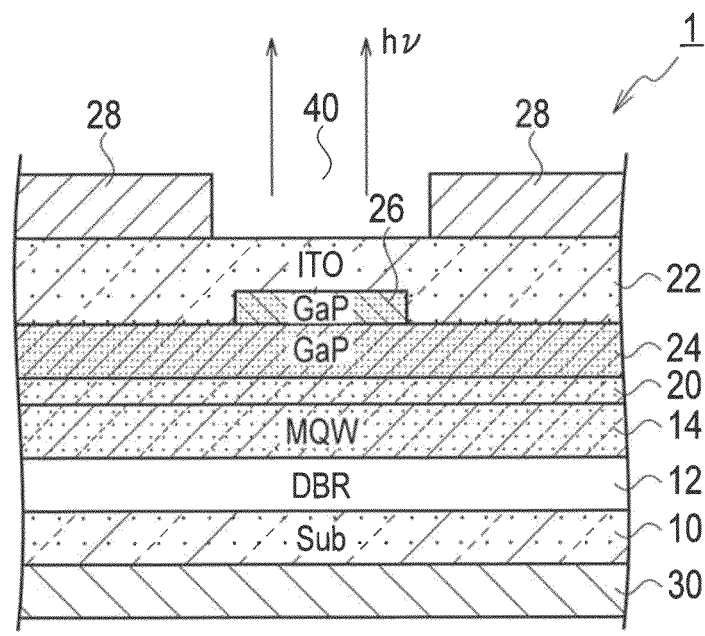
FIG. 8 shows a schematic cross-sectional structure diagram of the semiconductor light emitting device according to the embodiment (Sample 4).

Moreover, FIG. 5 shows a schematic cross-sectional structure near the aperture of the semiconductor light emitting device according to the comparative example (Sample 1), and FIGS. 6-8 respectively show schematic cross-sectional structures near the aperture of the semiconductor light emitting devices according to the embodiment (Samples 2-4). In FIGS. 5-8, although the illustrations are omitted, the first cladding layer 14 and the second cladding layer 18 are disposed thereon in the same manner as FIG. 2.

The semiconductor light emitting device according to the comparative example (Sample 1) includes only one layer of a first contact layer (GaP layer) 24 on the window layer 20, as shown in FIG. 5. Furthermore, an insulating layer 32, such as $SiO_2$, a surface electrode layer 28, and an aperture 40 are formed on the second contact layer 24.

As shown in FIG. 6, the semiconductor light emitting device according to the embodiment (Sample 2) includes: a second contact layer 24 formed on the entire surface of the window layer 20; and a first contact layer 26 formed on the entire surface of the second contact layer 24, and a portion of the first contact layer 26 corresponding to the aperture 40 is formed relatively thicker. Other configurations are the same as those of FIG. 2. The structure shown in FIG. 6 is structure easy to conduct more electric current through the relatively thickly-formed first contact layer 26 portion compared with the relatively thinly-formed first contact layer 26 portion.

As shown in FIG. 7, the semiconductor light emitting device according to the embodiment (Sample 3) includes: a second contact layer 24 formed on the entire surface of the window layer 20; and a first contact layer 26 formed at a portion looking in the aperture 40 on the second contact layer 24. Other configurations are the same as those of FIG. 2. The structure shown in FIG. 7 is structure easy to conduct more electric current through the first contact layer 26 portion compared with the second contact layer 24 portion.

As shown in FIG. 8, in the semiconductor light emitting device according to the embodiment (Sample 4), the thickness of the window layer 20 is formed relatively thinner than that of the semiconductor light emitting device according to the embodiment (Sample 3) shown in FIG. 7. Other configurations are the same as those of FIG. 7. In the structure of FIG. 8, it is possible to concentrate more electric current in the MQW layer 14 directly under the aperture 40 by forming relatively thinly the thickness of the window layer 20 which functions as the current diffusion layer.

(Semiconductor Light Emitting Device and Detection Photodiode)

Figure 9:
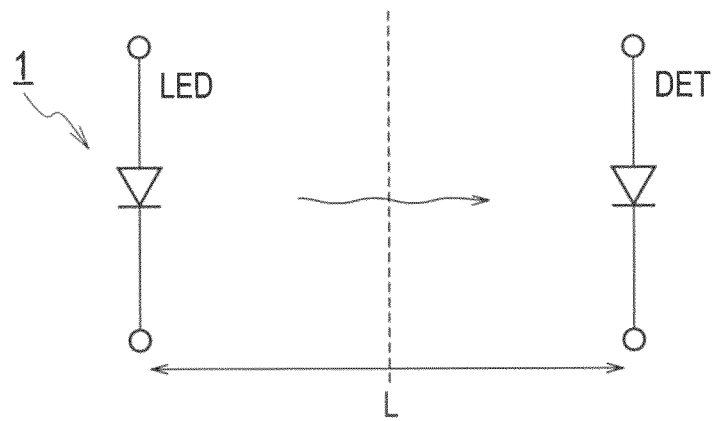
FIG. 9 shows a schematic diagram of a transceiver arrangement configuration of the semiconductor light emitting device (LED) and a detection photodiode (DET), according to the embodiment.

FIG. 9 shows a schematic diagram of a transceiver arrangement configuration of the semiconductor light emitting device (LED) and the detection photodiode (DET), according to the embodiment 1. The detection photodiode (DET) can detect OFF/ON in the LED light emitted from the semiconductor light emitting device (LED) 1 by placing or removing a shelter at a position shown with a dashed line within a distance L between the semiconductor light emitting device (LED) 1 and the detection photodiode (DET), and thereby it is applicable as an encoder for detecting a motor rotational position.

Figure 10:
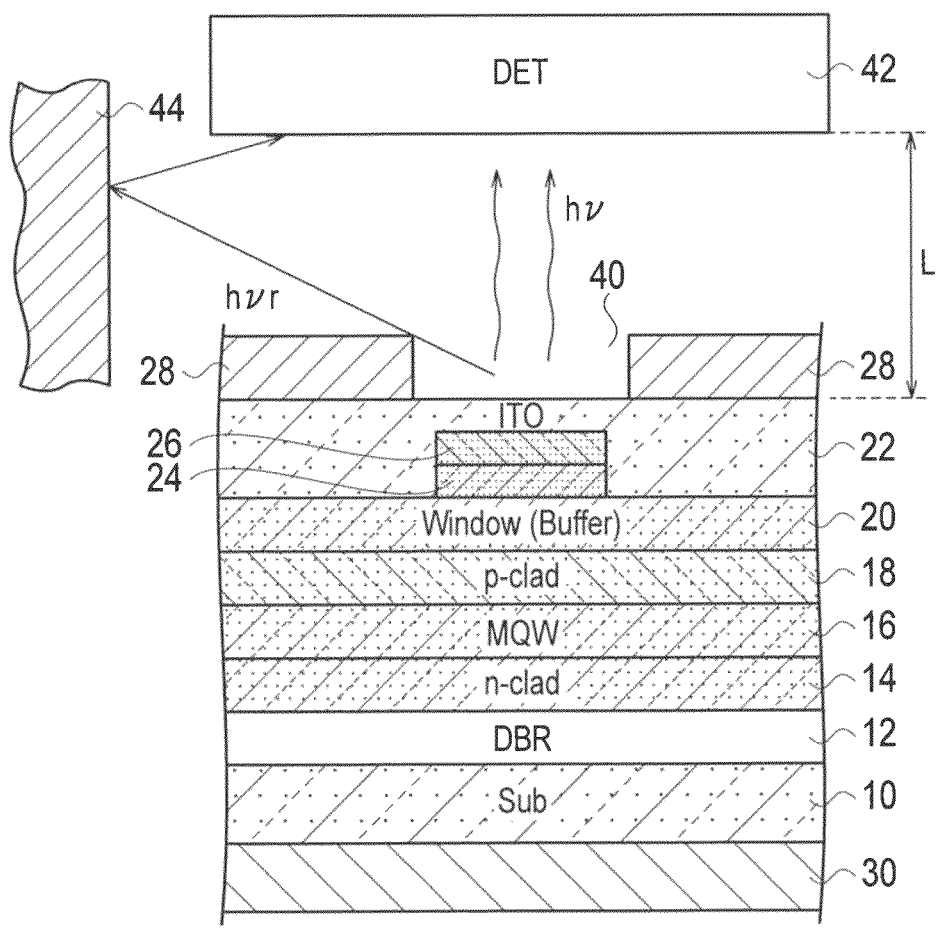
FIG. 10 shows a schematic cross-sectional structure diagram of the transceiver arrangement configuration of the semiconductor light emitting device (LED) and the detection photodiode (DET), according to the embodiment.

FIG. 10 shows a schematic cross-sectional structure of a transceiver arrangement configuration composed of the semiconductor light emitting device according to the embodiment (LED) and the detection photodiode (DET).

It is necessary to reduce a disturbance noise of the reflected light $hv_r$ incident into the detecting unit (DET) 42 via the reflecting layer 44 among the light by emitted from the semiconductor light emitting device according to the embodiment (LED). For this reason, it is necessary to shorten the distance L between the surface of the optically transmissive electrode layer 22 at the aperture 40, and the detecting unit (DET) 42.

In the semiconductor light emitting device according to the embodiment, the window layer 20, the first contact layer 26 and the second contact layer 24 are adapted as the p-type layers and the optically transmissive electrode layer (ITO) 22 is adapted as the n-type layer, and thereby the electric current is fundamentally interrupted. However, the electric current becomes possible to flow from the interface between the first contact layer 26 and the optically transmissive electrode layer (ITO) 22 by increasing the impurity density to the first contact layer 26 at some extent or more, in spite of the pn junction. On the other hand, the above-mentioned conduction effect is not achieved since the impurity densities of the second contact layer 24 and the window layer 20 are not high, the electric current does not flow from the interface between the second contact layer 24/the window layer 20 and the optically transmissive electrode layer (ITO) 22, due to a reverse bias of the pn junction.

(Forward Characteristics)

Figure 11:
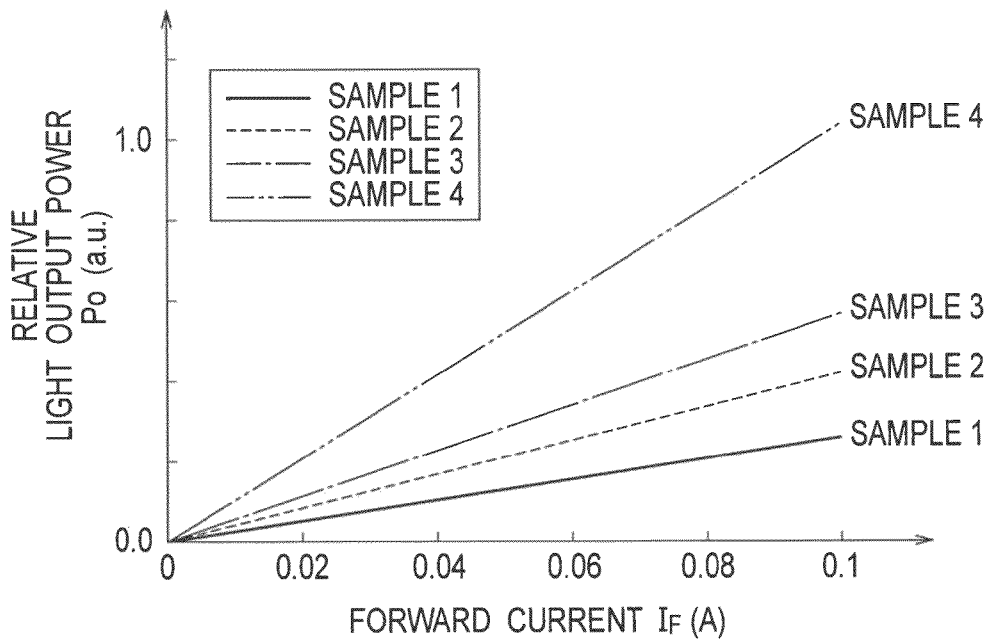
FIG. 11 is a characteristic diagram showing a relationship between relative light output power $P_O$ (a. u.) and forward current $I_F$ (A), in each of the semiconductor light emitting device according to the comparative example (Sample 1) and the semiconductor light emitting devices according to the embodiment (Samples 2-4).

FIG. 11 shows a relationship between the relative light output powers $P_O$ (a. u.) and the forward currents $I_F$ (A) in the semiconductor light emitting device according to the comparative example (Sample 1) and the semiconductor light emitting devices according to the embodiment (Samples 2-4). The forward current $I_F$ (A) characteristics of the relative light output power $P_O$ (a. u.) are improved in the semiconductor light emitting device according to the embodiment (Samples 2-4) compared with the semiconductor light emitting device according to the comparative example (Sample 1). In particular in the semiconductor light emitting device according to the embodiment (Sample 4), approximately 5 times amount of the relative light output power $P_O$ (a. u.) can be obtained in the forward current $I_F$ (A)=0.1 (A) compared with the semiconductor light emitting device according to the comparative example (Sample 1).

In particular in the semiconductor light emitting device according to the embodiment (Sample 4), it is possible to concentrate more electric current in the MQW layer 14 directly under the aperture 40 by forming relatively thinly the thickness of the window layer 20 which functions as the current diffusion layer, thereby improving the optical power characteristics.

Figure 12:
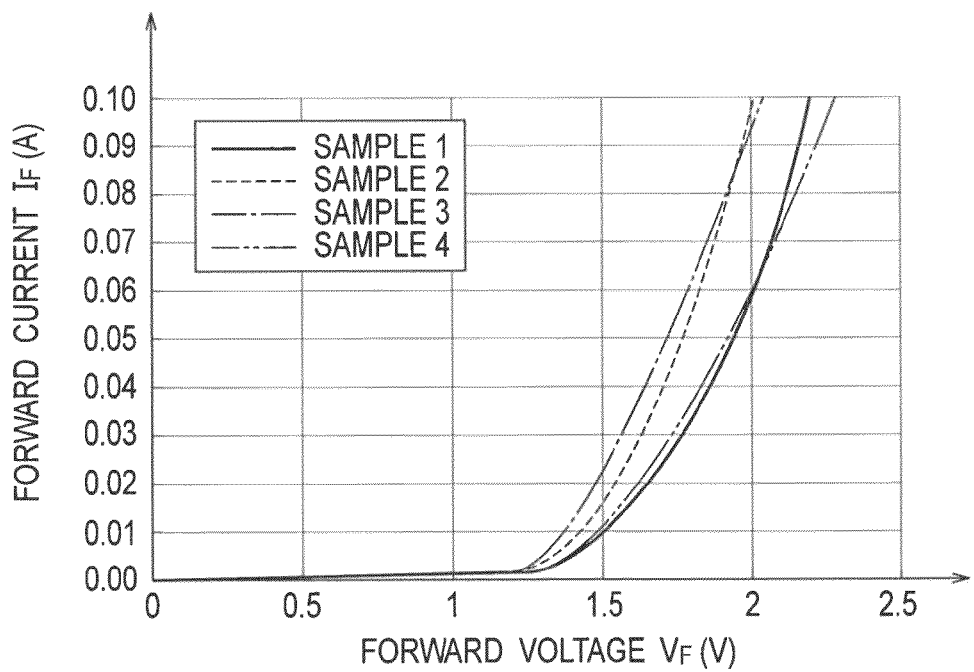
FIG. 12 is a characteristic diagram showing a relationship between the forward current $I_F$ (A) and forward voltage $V_F$ (V), in each of the semiconductor light emitting device according to the comparative example (Sample 1) and those of the semiconductor light emitting devices according to the embodiment (Samples 2-4).

Moreover, FIG. 12 shows a relationship between the forward current $I_F$ (A) and the forward voltage $V_F$ (V), in each of the semiconductor light emitting device according to the comparative example (Sample 1) and the semiconductor light emitting devices according to the embodiment (Samples 2-4). For example, in the forward current $I_F$=50 (mA), the forward voltage $V_F$=2.92 (V) in the semiconductor light emitting device according to the comparative example (Sample 1). On the other hand, in the semiconductor light emitting device according to the embodiment (Samples 2-4), the respective forward voltages $V_F$=1.75 (V), 1.71 (V), and 1.91 (V). In the forward current $I_F$=100 (mA), the forward voltage $V_F$=2.23 (V) in the semiconductor light emitting device according to the comparative example (Sample 1). On the other hand, in the semiconductor light emitting device according to the embodiment (Samples 2-4), the respective forward voltages $V_F$=2.00 (V), 2.04 (V), and 2.28 (V).

In particular in the semiconductor light emitting device according to the embodiment (Sample 4), it is possible to concentrate more electric current in the MQW layer 14 directly under the aperture 40 by forming relatively thinly the thickness of the window layer 20 which functions as the current diffusion layer, thereby improving the optical power characteristics and the forward characteristics.

Figure 13:
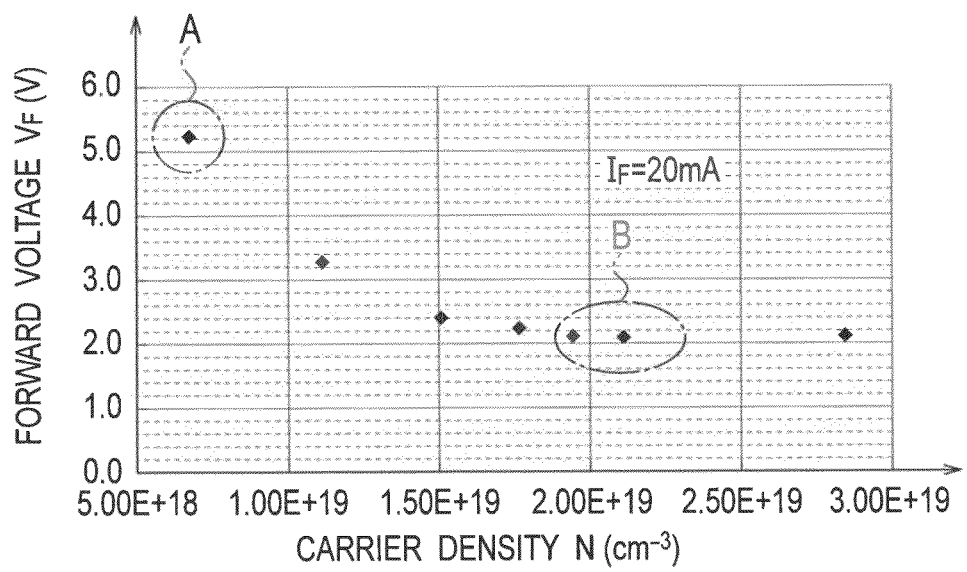
FIG. 13 is a characteristic diagram showing a relationship between the forward voltage $V_F$ (V) and carrier density N (cm$^{-3}$) of a contact layer, in the semiconductor light emitting device according to the embodiment.

FIG. 13 shows a relationship between the forward voltage $V_F$ (V) in the forward current $I_F$=20 (mA) and the carrier density N ($cm^{-3}$) of the contact layer, in the semiconductor light emitting device according to the embodiment. In FIG. 13, a sample encircled by the round mark A is an example of the carrier density N=6.78×10^{18} $cm^{-3}$ of the second contact layer 24, and the forward voltage $V_F$=5.231 (V) which is a relatively higher value is obtained.

On the other hand, samples encircled by the round mark B are examples of carrier densities N=1.94×10^{19} $cm^{-3}$ and 2.11×10^{19} $cm^{-3}$ of the first contact layer 26, and the forward voltages $V_F$=2.034 (V) and 2.002 (V) which are relatively lower value are obtained.

As shown in FIG. 13, it proves that the forward voltage $V_F$ is more reduced as the carrier density N of the contact layer becomes higher, and the forward voltage $V_F$ becomes approximately constant if the carrier density N of the contact layer becomes equal to or greater than 1.50×10^{19} $cm^{-3}$. That is, if the carrier density N of the contact layer is set to equal to or greater than 1.50×10^{19} $cm^{-3}$, the forward voltage $V_F$ can be reduced low.

(Relationship between Relative Light Output Power $P_O$ and Area Ratio $S_C/S_O$)

Figure 14:
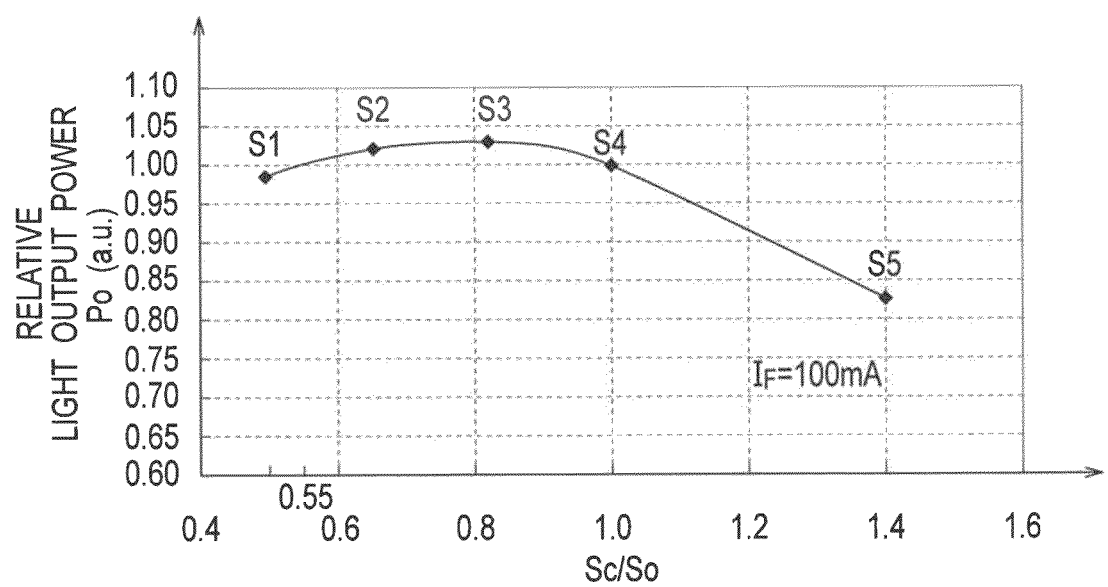
FIG. 14 is a characteristic diagram showing a relationship between the relative light output power $P_O$ (a. u.) and area ratio $S_C/S_O$ of the area $S_C$ of a contact unit with respect to the area $S_O$ of an aperture in the semiconductor light emitting device according to the embodiment.

FIG. 14 shows a relationship between the relative light output power $P_O$ (a. u.) in the forward current $I_F$=20 (mA) and the area ratio $S_C/S_O$ of area $S_C$ of the contact part with respect to area $S_O$ of the aperture, in the semiconductor light emitting device 1 according to the embodiment. In FIG. 14, the areas $S_C$ of the contact parts in the samples S1-S5 are different one another, and the respective areas $S_C$=160 μm×40 μm, 170 μm×50 μm, 180 μm×60 μm, 190 μm×70 μm, and 210 μm×90 μm, corresponding to the area ratio $S_C/S_O$=0.49, 0.65, 0.82, 1.00, and 1.40.

In the semiconductor light emitting device 1 according to the embodiment, the relationship between the relative light output power $P_O$ (a. u.) and the area ratio $S_C/S_O$ has an optimum value satisfying $S_C/S_O<1$, as shown in FIG. 14. Accordingly, in the semiconductor light emitting device 1 according to the embodiment, the area ratio $S_C/S_O$ of the contact part with respect to the aperture is set as smaller than 1. However, it is not need to make the area ratio $S_C/S_O$ smaller than 1, and the area ratio $S_C/S_O$ can be selected as usage.

Within the range of $0.55<S_C/S_O<1.0$, a value which exceeds the relative light output power $P_O$ at the time of $S_C/S_O=1$ is obtained. On the other hand, within the range of $1.00<S_C/S_O<1.4$, a value smaller than the relative light output power $P_O$ at the time of $S_C/S_O=1$ is obtained. That is, within the range of $1.00<S_C/S_O<1.4$, it is considered that since the area of the electric contact is large, the electric current is diffused and therefore the light emitting region is also extended, and the quantity of light which cannot be extracted is increased by shielding the light by the electrode.

Figure 15A:
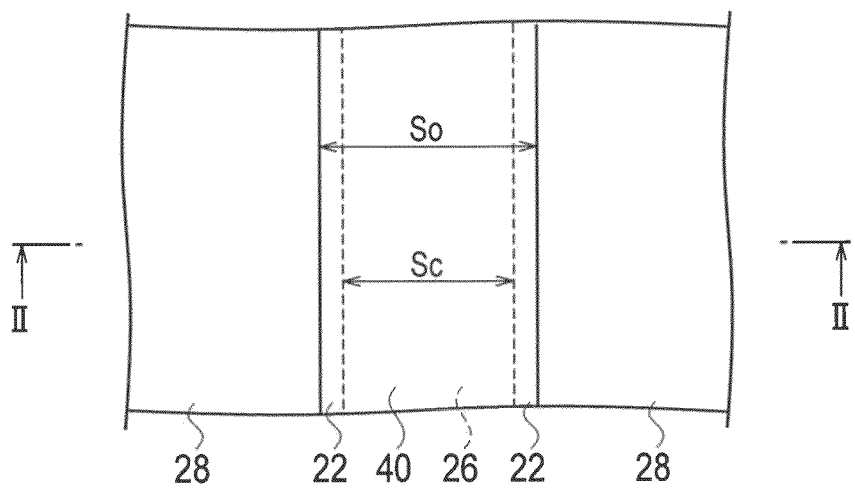
FIG. 15A shows an enlarged schematic planar pattern configuration diagram of a portion near the aperture, in the semiconductor light emitting device according to the embodiment.
Figure 15B:
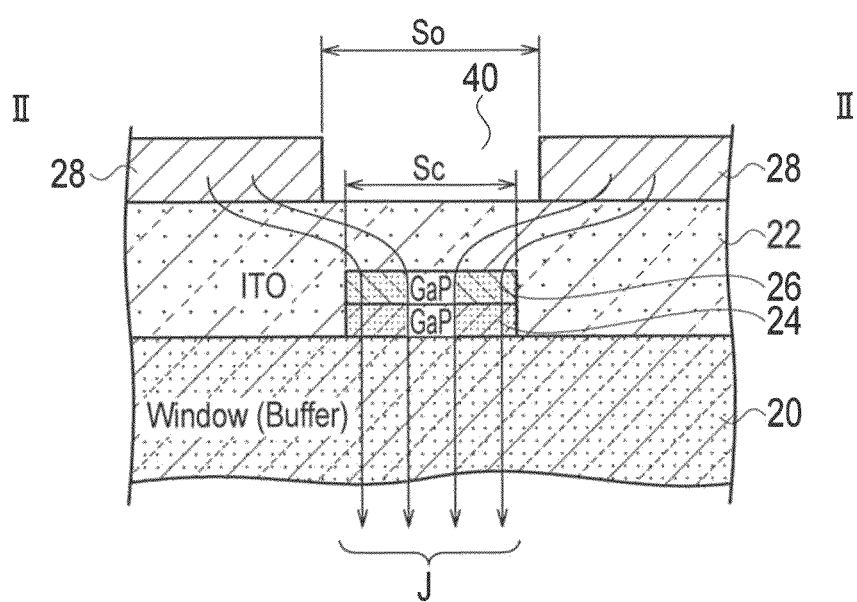
FIG. 15B shows a schematic cross-sectional structure diagram taken in the line II-II of FIG. 15A.

In the semiconductor light emitting device according to the embodiment, FIG. 15A shows an enlarged schematic planar pattern configuration of a portion near the aperture 40, and FIG. 15B shows a schematic cross-sectional structure taken in the line II-II of FIG. 15A.

As shown with the arrows in FIG. 15B, the electric currents J are conducted to the surface electrode layer 28/the optically transmissive electrode layer 22/the first contact layer 26/the second contact layer 24/the window layer 20 by setting up the area $S_C$ of the contact part smaller than the area $S_O$ of the aperture.

In the semiconductor light emitting device according to the embodiment, the area $S_C$ of the contact part is formed smaller than the area $S_O$ of the aperture, thereby reducing light-emitting loss due to the electric current diffraction and improving the light emitting power.

(Aperture Shape)

The aperture 40 can be formed in various shapes, e.g. not only an elliptical shape but also an oval shape, a circle shape, a triangular shape, a square shape, a rhombic shape, a rectangular shape, a pentagon shape, a hexagon shape, an octagonal shape, etc., in the semiconductor light emitting device according to the embodiment.

Figure 16A:
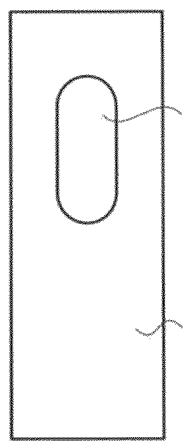
FIGS. 16A-16I shows schematic plane configurations of the semiconductor light emitting device according to the embodiment of which the apertures are different from each other.
Figure 16B:
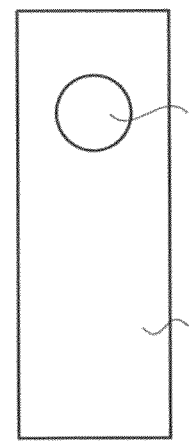
Figure 16C:
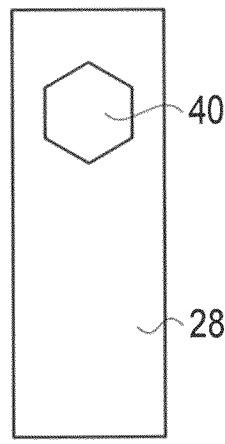
Figure 16D:
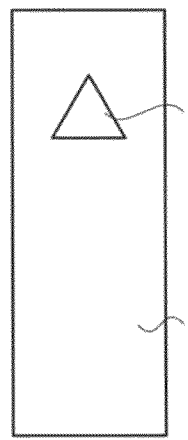
Figure 16E:
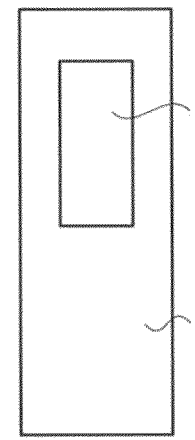
Figure 16F:
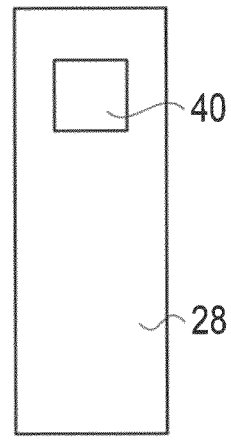
Figure 16G:
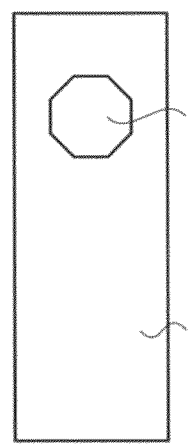
Figure 16H:
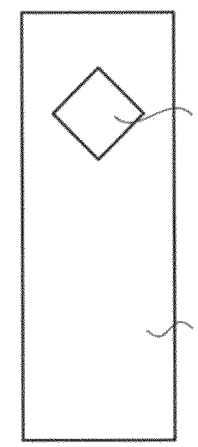
Figure 16I:
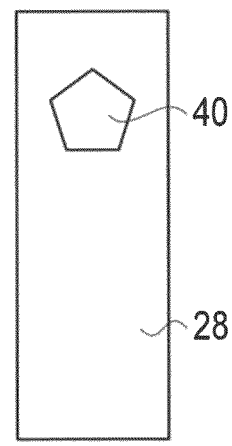

In the aperture 40 of the semiconductor light emitting device 1 according to the embodiment, an example of an oval-shaped aperture 40 is shown in FIG. 16A, an example of a circle-shaped aperture 40 is shown in FIG. 16B, an example of a hexagon-shaped aperture 40 is shown in FIG. 16C, an example of a triangular-shaped aperture 40 is shown in FIG. 16D, an example of a rectangular-shaped aperture 40 is shown in FIG. 16E, an example of a square-shaped aperture is shown in FIG. 16F, an example of an octagonal-shaped aperture 40 is shown in FIG. 16G, an example of a rhombic-shaped aperture 40 is shown in FIG. 16H, and an example of a pentagon-shaped aperture 40 is shown in FIG. 16I.

Also in any shapes, the area ratio $S_C/S_O$ of the area $S_C$ of the first contact layer 26, with respect to the area $S_O$ of the aperture 40 placed in a portion looking in the aperture 40 in a direction perpendicular to the aperture 40 is formed smaller than 1 so that the relative light output power $P_O$ can be maximized. Furthermore, the semiconductor light emitting device according to the embodiment is formed so that the aperture region and the electric contact may not overlap with each other in planar view, other than the area ratio.

(Carrier Density and Flow Rate)

Figure 17:
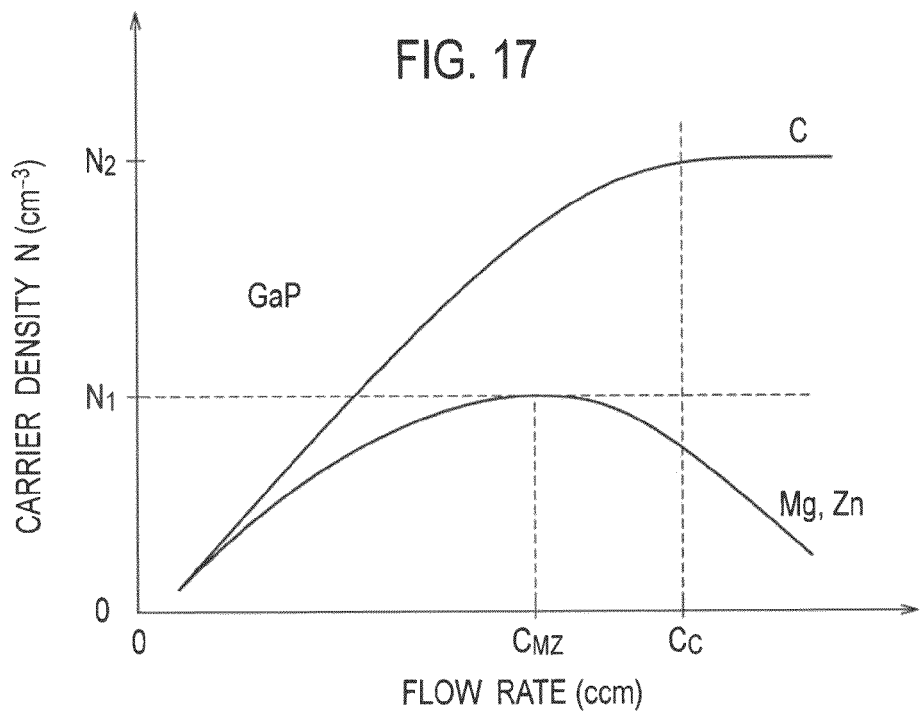
FIG. 17 is a schematic diagram showing a relationship between carrier density N (cm$^{-3}$) of a GaP contact layer, and the flow rate (ccm) of a doping gas, in the semiconductor light emitting device according to the embodiment.

FIG. 17 shows a relationship between the carrier density N (cm$^{-3}$) of the GaP contact layer (26, 24), and the flow rate (ccm) of the doping gas, in the semiconductor light emitting device according to the embodiment. In the embodiment, the flow rate (ccm) of the doping gas is a quantity corresponding to the atomic weight (piece) of the doping impurities. FIG. 17 shows a trend obtained experimentally. For example, in the case where the doping impurities are magnesium (Mg) or zinc (Zn), although the carrier density N (cm$^{-3}$) tends to be increased as the flow rate (ccm) of the doping gas is increased, and the carrier density N (cm$^{-3}$) becomes a peak in the carrier density $N_1$ at a specific flow rate $C_{MZ}$, and then trends to be decreased subsequently. On the other hand, if the doping impurities are carbon (C), the carrier density N (cm$^{-3}$) tends to be increased as the flow rate (ccm) of the doping gas is increased, and the carrier density N (cm$^{-3}$) becomes a saturation value in the carrier density $N_2$ at a specific flow rate $C_C$, and then trends to be a substantially constant subsequently. As an obtained experimental result, the value of the carrier density $N_1$ is approximately $6\times10^{18}$ (cm$^{-3}$), but the value of the carrier density $N_2$ is approximately $5\times10^{19}$ (cm$^{-3}$), for example. It has been confirmed that the crystallinity worsens with the tendency to decrease the carrier density, after reaching the peak value in the carrier density $N_1$ if the doping impurities are magnesium (Mg) or zinc (Zn). On the other hand, if the doping impurities are carbon (C), even after the carrier density N (cm$^{-3}$) becomes the saturation value in the carrier density $N_2$, the carrier density becomes the substantially constant, and therefore the crystallinity does not worsen. However, if the doping impurities are carbon (C), while increasing the thickness of the GaP contact layer (26), it is effective to form the double layer structure in which the first contact layer 26 is formed on the second contact layer 24, after forming the second contact layer 24 as an underlying buffer layer on the window layer 20, since there is a trend to increase crystal defects.

As a result, in the semiconductor light emitting device according to the embodiment, the crystallinity of the contact layer can be improved, and the contact resistance can be reduced, thereby achieving the reduction of the forward voltage $V_F$ and the increase of relative light output power $P_O$.

Modified Example

Although the embodiment discloses the example that the conductivity type of the substrate 10 and the first cladding layer 14 are the n-type conductivity, and the conductivity type of the second cladding layer 18 are the p-type conductivity, these conductivity types may be reverse to each other.

Figure 18:
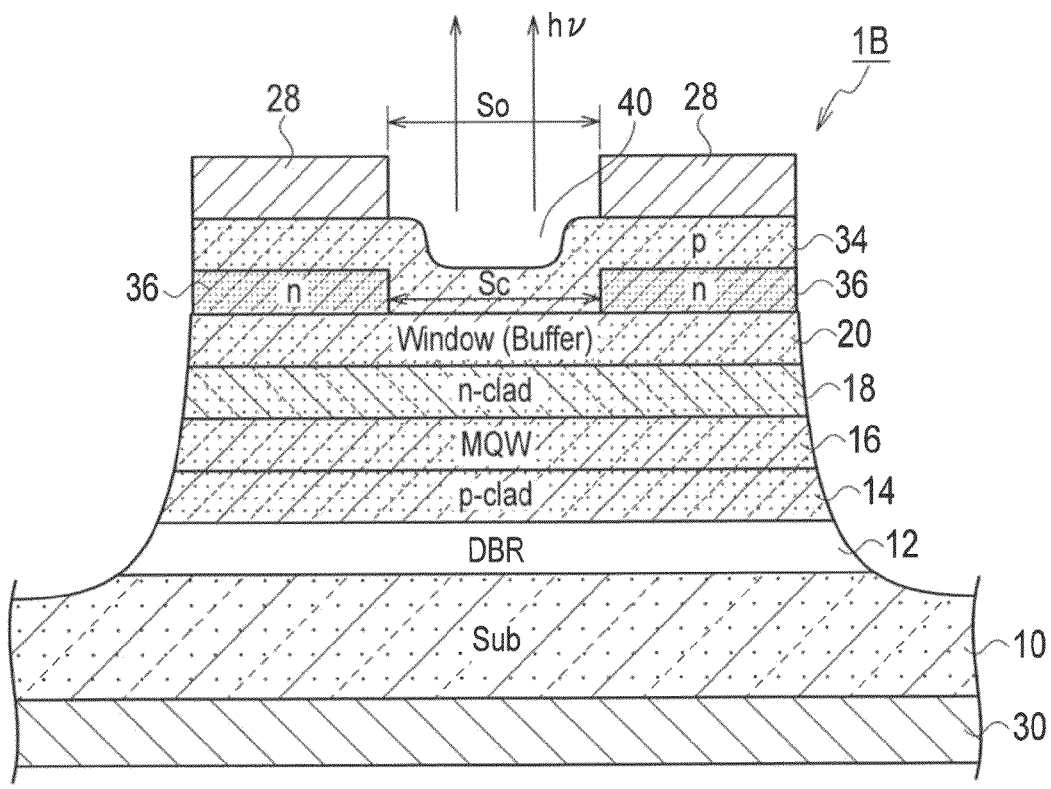
FIG. 18 shows a schematic cross-sectional structure diagram of a semiconductor light emitting device according to a modified example of the embodiment.

FIG. 18 shows a schematic cross-sectional structure of a semiconductor light emitting device 1B according to a modified example of the embodiment. The semiconductor light emitting device 1B according to the modified example of the embodiment has a configuration in which the conductivity types are reverse to those of the semiconductor light emitting device 1 according to the embodiment. More specifically, the first cladding layer 14 is formed of a p-type $Al_{0.6}Ga_{0.4}As$ layer doped with zinc (Zn), for example, the second cladding layer 18 is formed of an n-type $Al_{0.6}Ga_{0.4}As$ layer doped with silicon (Si), for example, and the window layer 20 is formed of an n-type $Al_{0.3}Ga_{0.7}As$ layer doped with silicon (Si), for example.

The optically transmissive electrode layer 34 formed of TCO used for the p-type semiconductor is disposed on the window layer 20, and the surface electrode layer 28 in which the aperture 40 is pattern-formed is disposed on then optically transmissive electrode layer 34. In addition, an n-type semiconductor layer 36 for current concentration may be disposed on the window layer 20 at a lower part of the surface electrode layer 28. The contact region between the optically transmissive electrode layer 34 enclosed with the n-type semiconductor layer 36 and the window layer 20 is used for the contact part of the semiconductor light emitting device 1B according to the modified example of the embodiment.

More specifically, as shown in FIG. 18, the semiconductor light emitting device 1 according to the modified example of the embodiment includes: a substrate 10; a first cladding layer 14 disposed on the substrate 10; a multi-quantum well layer 16 disposed on the first cladding layer 14; a second cladding layer 18 disposed on the multi-quantum well layer 16; a contact part (contact region between the optically transmissive electrode layer 34 and the window layer 20) disposed at a predetermined region on the second cladding layer 18; an optically transmissive electrode layer 22 disposed on the contact layer unit; a surface electrode layer 28 disposed on the optically transmissive electrode layer 22; and an aperture 40 formed by opening the region corresponding to a predetermined region of the surface electrode layer 28.

The relationship between the area ratio $S_C/S_O$ of the area $S_C$ of the contact part with respect to the area $S_O$ of the aperture and the relative light output power $P_O$ is the same as that of the semiconductor light emitting device 1 according to the embodiment. ZnO etc. are applicable to the optically transmissive electrode layer 34 formed with TCO used for the p-type semiconductor, for example. In the semiconductor light emitting device 1 according to the modified example of the embodiment B, the surface electrode layer 28 is a cathode, and the back surface electrode layer 30 is an anode. Other configurations are the same as those of the embodiment.

The semiconductor light emitting device 1 according to the modified example of the embodiment B also has the configuration easy to concentrate the electric current in the MQW layer 16 at the lower part of the aperture 40, in the same manner as the semiconductor light emitting device 1 according to the embodiment, thereby providing the current constricted type semiconductor light emitting device of which the light extracting efficiency can be improved to achieve high luminance.

As explained above, according to the present invention, there can be provided the current constricted type semiconductor light emitting device of which the light extracting efficiency can be improved to achieve high luminance. Moreover, since the electric current is constricted by contacting the transparent electrode with the contact layer/the window layer of which the conductivity type is reverse to the transparent electrode, each layer can be easily patterned. Accordingly, since the current constricted portion can be formed with sufficient accuracy unlike the case where the impurities are diffused, the light emitting element can be easily miniaturized.

Other Embodiments

As explained above, the present invention has been described with the embodiment and its modified example, as a disclosure including associated description and drawings to be construed as illustrative, not restrictive. This disclosure makes clear a variety of alternative embodiments, working examples, and operational techniques for those skilled in the art.

Although, the embodiment discloses mainly an example that the GaAs substrate is applied to the substrate 10, it is also possible to apply a silicon substrate, an SiC substrate, a GaP substrate, an InP substrate, a sapphire substrate, etc. to the substrate 10. The sapphire substrate and the SiC substrate are applicable to a GaN-based semiconductor light emitting device. The InP substrate is applicable to an InP-based semiconductor light emitting device.

Moreover, the first cladding layer and the second cladding layer may be formed of an $In_{0.5}Al_{0.5}P$ layer. Moreover, the MQW layer may be formed by laminating a quantum well layer composed of an $In_{0.5}Ga_{0.5}P$ layer and a barrier layer composed of an undoped $In_{0.5}(Ga_{0.15}Al_{0.85})_{0.5}P$ layer repeatedly at a plurality of periods one after the other. In this case, a visible semiconductor light emitting element is obtained.

Such being the case, the present invention covers a variety of embodiments, whether described or not. Therefore, the technical scope of the present invention is determined from the invention specifying items related to the claims reasonable from the above description.

What is claimed is:

1. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein an impurity density of a portion of the contact layer in contact with the optically transmissive electrode layer is equal to or greater than $1.5 \times 10^{19}$ cm$^{-3}$.

2. The semiconductor light emitting device according to claim 1, wherein the emitting layer includes a multi-quantum well layer.

3. The semiconductor light emitting device according to claim 1, wherein the optically transmissive electrode layer has a conductivity type opposite to that of the contact layer and the second cladding layer.

4. The semiconductor light emitting device according to claim 3, wherein the conductivity type of the optically transmissive electrode layer is an n type, and the conductivity type of each of the contact layer and the second cladding layer is p type.

5. The semiconductor light emitting device according to claim 1, wherein the optically transmissive electrode layer is formed so as to be directly contacted with the contact layer and a layer formed at an opposite side to the optically transmissive electrode layer with respect to the contact layer, the layer contacted the contact layer.

6. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein an impurity density of a portion of the contact layer in contact with the optically transmissive electrode layer is equal to or greater than $1.5 \times 10^{19}$ cm$^{-3}$, wherein the contact layer comprises:
a first contact layer in contact with the optically transmissive electrode layer; and
a second contact layer having an impurity density lower than that of the first contact layer, the second contact layer formed in a side opposite to the optically transmissive electrode layer with respect to the first contact layer.

7. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein the contact layer comprises:
a first contact layer in contact with the optically transmissive electrode layer; and
a second contact layer having an impurity density lower than that of the first contact layer, the second contact layer formed in a side opposite to the optically transmissive electrode layer with respect to the first contact layer.

8. The semiconductor light emitting device according to claim 7, wherein the impurity doped in the first contact layer is carbon.

9. The semiconductor light emitting device according to claim 8, wherein the carbon density in the first contact layer is equal to or greater than $1.5 \times 10^{19}$ cm$^{-3}$, but not more than $5.0 \times 10^{19}$ cm$^{-3}$.

10. The semiconductor light emitting device according to claim 7, wherein a thickness of the first contact layer is equal to or greater than 0.3 μm, but equal to or less than 0.8 μm.

11. The semiconductor light emitting device according to claim 7, wherein the thickness of the first contact layer is thinner than the thickness of the second contact layer.

12. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein an area ratio of the contact layer to an area of the aperture is smaller than 1, and all periphery of the contact layer is positioned inside a periphery of the aperture.

13. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein the contact layer has a composition not lattice-matched with the substrate, the contact layer further comprises a window layer formed on the second cladding layer, and the contact layer is formed on the second cladding layer via the window layer.

14. The semiconductor light emitting device according to claim 13, wherein the substrate is formed of GaAs, the window layer is formed of a GaAs layer or an AlGaAs layer, and each of the first contact layer and the second contact layer is formed of a GaP layer.

15. The semiconductor light emitting device according to claim 13, wherein the substrate is formed by GaAs, the second cladding layer is formed of an AlGaAs layer, the window layer is formed of an AlGaAs layer of which Ga concentration is higher than that of the second cladding layer, and each of the first contact layer and the second contact layer is formed of a GaP layer.

16. The semiconductor light emitting device according to claim 13, wherein the thickness of the window layer is thinner than the thickness of the second cladding layer.

17. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein an impurity density of a portion of the contact layer in contact with the optically transmissive electrode layer is equal to or greater than $1.5 \times 10^{19}$ cm$^{-3}$, and
wherein the optically transmissive electrode layer is formed of TCO.

18. The semiconductor light emitting device according to claim 17, wherein the TCO is formed of any one selected from the group consisting of ITO, $In_2O_3$, $SnO_2$, ZnO, and InZO.

19. A semiconductor light emitting device, comprising:
a substrate;
a first cladding layer disposed on the substrate;
an emitting layer disposed on the first cladding layer;
a second cladding layer disposed on the emitting layer;
a contact layer disposed at a predetermined region on the second cladding layer;
an optically transmissive electrode layer disposed on the contact layer;
a surface electrode layer disposed on the optically transmissive electrode layer; and
an aperture formed by opening a region corresponding to the predetermined region of the surface electrode layer,
wherein a distributed Bragg reflector layer is formed between the substrate and the first cladding layer.

20. The semiconductor light emitting device according to claim 19, wherein the distributed Bragg reflector layer is formed of a pair of GaAs/AlGaAs.

21. A semiconductor light emitting device, comprising:
a substrate;
a first cladding layer disposed on the substrate;
an emitting layer disposed on the first cladding layer;
a second cladding layer disposed on the emitting layer;

a contact layer disposed at a predetermined region on the second cladding layer;

an optically transmissive electrode layer disposed on the contact layer;

a surface electrode layer disposed on the optically transmissive electrode layer; and an aperture formed by opening a region corresponding to the predetermined region of the surface electrode layer, wherein a shape of the aperture is one selected from the group consisting of an oval shape, a circle shape, a triangular shape, a square shape, a rhombic shape, a rectangular shape, a pentagon shape, a hexagon shape, and an octagonal shape.

22. The semiconductor light emitting device according to claim 1, wherein the substrate is formed of GaAs, each of the first cladding layer and the second cladding layer is formed of an AlGaAs layer, and the multi-quantum well layer is formed of a pair of GaAs/AlGaAs.

* * * * *